(12) United States Patent
Mooraka et al.

(10) Patent No.: US 9,641,165 B1
(45) Date of Patent: May 2, 2017

(54) BOUNDED DUTY CYCLE CORRECTION CIRCUIT

(71) Applicant: FREESCALE SEMICONDUCTOR, INC., Austin, TX (US)

(72) Inventors: Venkataram Mooraka, Austin, TX (US); Firas Abughazaleh, Austin, TX (US); Roby Thomas, Austin, TX (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/169,806

(22) Filed: Jun. 1, 2016

(51) Int. Cl.
| H03K 3/017 | (2006.01) |
| H03K 5/04 | (2006.01) |
| H03K 7/08 | (2006.01) |
| H03K 5/156 | (2006.01) |
| H03F 3/45 | (2006.01) |
| H03K 5/06 | (2006.01) |

(52) U.S. Cl.
CPC ....... H03K 5/1565 (2013.01); H03F 3/45475 (2013.01); H03K 5/06 (2013.01)

(58) Field of Classification Search
USPC ................................................. 327/172, 175
See application file for complete search history.

(56) References Cited

U.S. PATENT DOCUMENTS

| 7,423,467 B1 | 9/2008 | Simon |
| 7,554,374 B2 | 6/2009 | Fairbanks |
| 8,248,130 B2 | 8/2012 | Jain et al. |
| 8,552,778 B2 | 10/2013 | Sofer et al. |
| 2009/0128206 A1* | 5/2009 | Boerstler ............... H03L 7/0995 327/175 |
| 2012/0081163 A1* | 4/2012 | Hesen .................... H03K 21/08 327/175 |
| 2012/0306554 A1* | 12/2012 | Ma ................... H03K 19/00361 327/165 |
| 2015/0002201 A1* | 1/2015 | Kitagawa ............. H03K 5/1565 327/175 |
| 2016/0365863 A1* | 12/2016 | Deng ...................... H03L 7/087 |
| 2016/0365864 A1* | 12/2016 | Deng ...................... H03L 7/087 |

OTHER PUBLICATIONS

Chen, Poki et al.: "A Low Power Wide Range Duty Cycle Corrector Based on Pulse Shrinking/Stretching Mechanism", IEEE Asian Solid-State Circuits Conference, Jeju, Korea, Nov. 12-14, 2007, pp. 460-463.

* cited by examiner

*Primary Examiner* — Adam Houston

(57) ABSTRACT

A duty cycle correction circuit has a delay line comprising a plurality of current-starved inverters coupled together in series. An input of a first current-starved inverter receives an input clock signal. A relatively weak inverter is coupled in parallel with each of the current-starved inverters. A low pass filter having an operational amplifier has a differential input coupled to the output of the delay line for receiving an output clock signal. A single-ended output of the operational amplifier is coupled to current source and current sink transistors of each of the current-starved inverters to control the amount of delay provided by the delay line. The low pass filter corrects the duty cycle of the input clock signal so that the output clock signal has a 50 percent duty cycle. The relatively weak parallel-connected inverters insure that no clock pulses are skipped if the current-starved inverters fail to transition.

20 Claims, 6 Drawing Sheets

BOUNDED DUTY CYCLE CORRECTION CIRCUIT

BACKGROUND

Field

This disclosure relates generally to electronic circuits and more specifically to a duty cycle correction circuit having bounds on duty cycle deviation.

Related Art

A duty cycle is a percentage of a period of an active, or periodic, signal.

Commonly, it is desired that the duty cycle of a clock signal is 50 percent. A duty cycle corrector receives an input clock signal having a duty cycle different from desired and generates a clock signal having the same frequency but with a duty cycle closer to the desired duty cycle, for example, 50 percent. One duty cycle corrector includes a delay line having a plurality of series-connected current-starved inverters that function as the delay cells, and a differential operational amplifier based low-pass filter in a feedback loop from an output of a last inverter in the series to a first inverter. A current-starved inverter has an inverter with a current source and a current sink for controlling the current to the inverter from a power supply in response to a bias voltage. The bias voltage is provided by the low pass filter. If the supply voltage is reduced, such as in a low power operating mode, the current sourcing and sinking transistors of the delay cells turn off too much, which can completely shut off current source and/or current sink of the current-starved inverter, causing clock pulses to be skipped. The problem of skipped pulses is sometimes referred to as pulse swallowing. The skipped pulses will result in a corrupted output clock signal.

FIG. 1 illustrates, in schematic diagram form, duty cycle correction circuit 8 in accordance with the prior art. Duty cycle correction circuit 8 includes delay line 11, low pass filter 14, buffers 58 and 60, and inverter 62. Delay line 11 includes current-starved inverters 17, 19, and 21, and inverters 32, 44, and 56. Low pass filter 14 includes operational amplifier 64, resistors 66 and 68, and capacitors 70 and 72 and has differential inputs connected to the output of duty cycle correction circuit 8, and a single-ended output connected to each of the current source and current sink transistors of the delay line 11. In delay line 11, the current-starved inverters are connected in series with simple two-transistor inverters, where one two-transistor inverter follows each current-starved inverter. Each of the current-starved inverters is provided with a feedback bias voltage VBIAS from the output of low pass filter 14. The feedback bias voltage VBIAS controls the amount of delay for each pulse so that the output clock signal labeled "CLK OUT" has a 50 percent duty cycle. However, if bias voltage VBIAS skews too close to power supply voltage VDD, or to ground VSS because of a highly skewed input clock duty cycle, or if the power supply voltage drops too low, the current-starved inverters may fail to transition from one state to another. In FIG. 2, an input clock signal labeled "CLK IN" has a duty cycle different from 50 percent. One clock period of input clock signal CLK IN starts at time t0 and ends at time t2. Four clock periods are illustrated between time t0 and time t8. An output clock signal should have the same frequency with a duty cycle of 50 percent. FIG. 2 illustrates skipped inverter transitions so that some of the clock cycles are skipped because one or more of the inverters lacked sufficient current to transition. The corrupted output clock may cause data errors and/or a system malfunction.

Therefore, a need exists for a duty cycle correction circuit that solves the above problems.

BRIEF DESCRIPTION OF THE DRAWINGS

The present invention is illustrated by way of example and is not limited by the accompanying figures, in which like references indicate the same or similar elements between the various embodiments. Elements in the figures are illustrated for simplicity and clarity and have not necessarily been drawn to scale.

DETAILED DESCRIPTION

Figure 1:
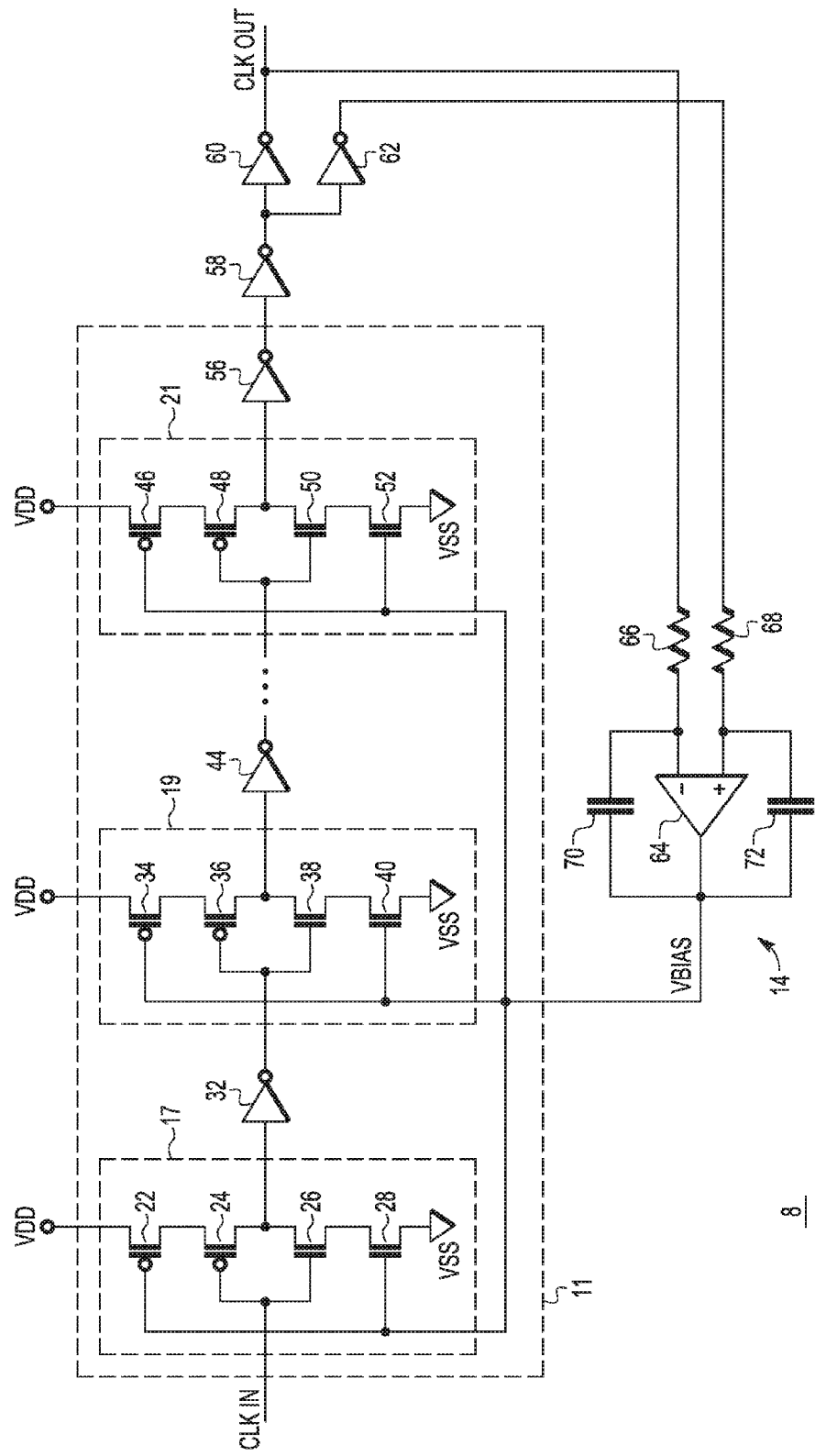
FIG. 1 illustrates, in schematic diagram form, a duty cycle correction circuit in accordance with the prior art.
Figure 2:
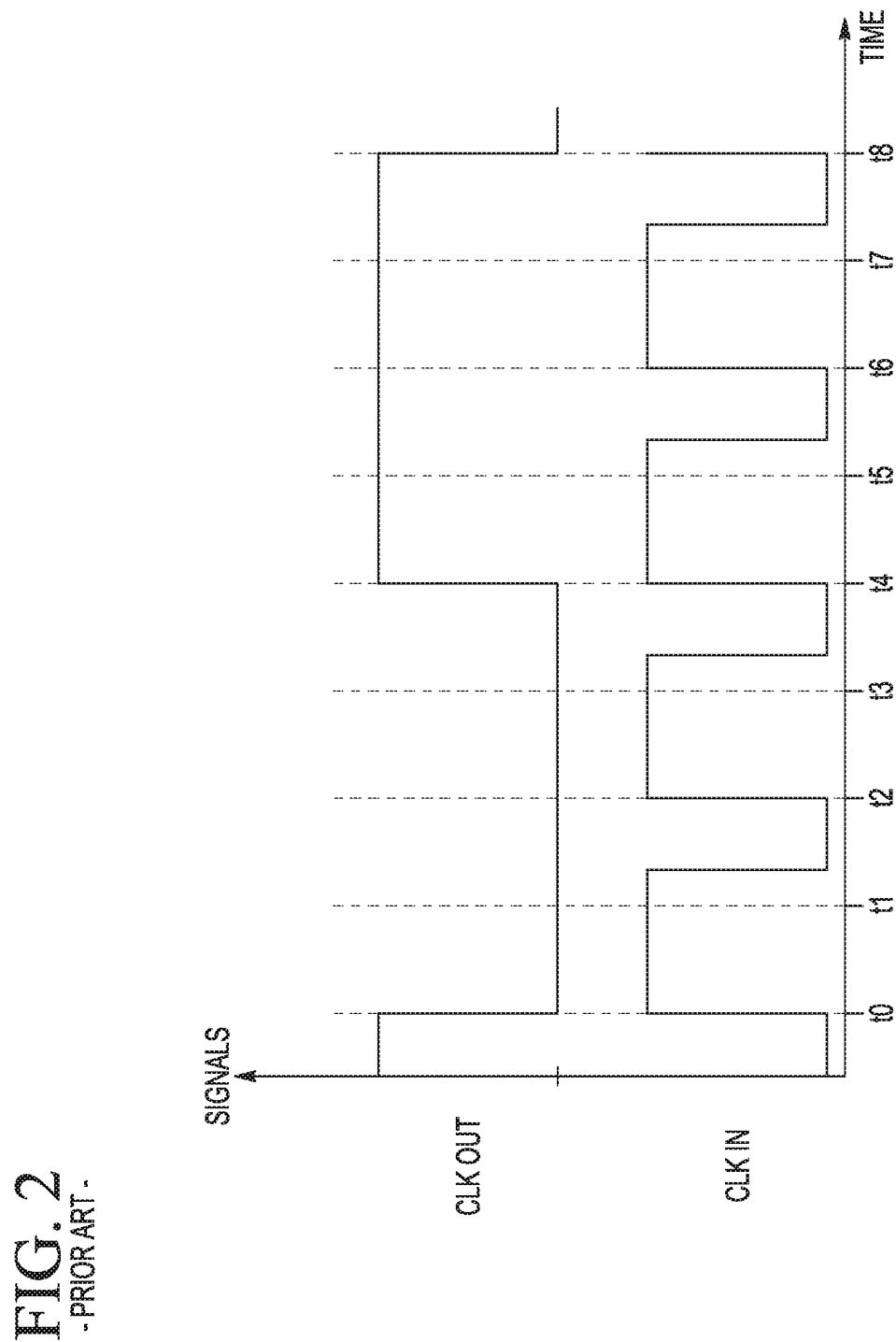
FIG. 2 illustrates, a timing diagram for illustrating a clock swallowing problem with the prior art duty cycle correction circuit of FIG. 1.

Generally, there is provided, a duty cycle correction circuit having a delay line comprising a plurality of current-starved inverters coupled together in series. An input of a first current-starved inverter receives an input clock signal. A relatively weak inverter is coupled in parallel with each of the current-starved inverters. A low pass filter based on an operational amplifier has a differential input coupled to the output of the delay line for receiving an output clock signal. A single-ended output of the operational amplifier is coupled to current source and current sink transistors of each of the current-starved inverters to control the amount of delay provided by the delay line. The low pass filter provides a bias voltage to correct the duty cycle of the input clock signal so that the output clock signal has a 50 percent duty cycle. If the bias voltage provided to the current starved inverters drops too low, or alternately, increases too high for reliable operation of the current-starved inverters, the relatively weak parallel-connected inverters insure that no clock pulses are skipped because the current-starved inverters fail to transition. Also, the parallel-connected inverters provides duty cycle correction bounding so that the output clock signal does not become a DC signal.

In one embodiment, there is provided, a duty cycle correction circuit comprising: a plurality of series-coupled current-starved inverters having a beginning inverter for receiving a periodic input signal having a first duty cycle and a ending inverter for providing an output clock signal having a second duty cycle; a feedback circuit coupled between the last current-starved inverter and the beginning current-starved inverter of the plurality of series-coupled current starved inverters; and a plurality of inverters, an inverter of the plurality of inverters coupled in parallel with a current-starved inverter of the plurality of series-connected current-starved inverters. Each of the current-starved inverter may comprise: a first P-channel transistor having a first current electrode coupled to a first power supply voltage terminal, a control electrode for receiving the input clock signal, and a second current electrode; a second P-channel transistor having a first current electrode coupled to the second current electrode of the first P-channel transistor, a control electrode coupled to an output terminal of the feedback circuit, and a second current electrode; a first N-channel transistor having a first current electrode coupled to the second current electrode of the second P-channel transistor, a control electrode coupled to the control electrode of the second P-channel transistor, and a second current electrode; and a second N-channel transistor having a first current electrode coupled to the second current electrode of the first N-channel transistor, a control electrode coupled to the control electrode of the first P-channel transistor, and a second current electrode coupled to a second power supply voltage terminal. An output of the feedback circuit may be coupled to the current electrodes of the first P-channel transistor and the second N-channel transistor of each of the current-starved inverters. The feedback circuit may comprise a low pass filter. The low pass filter may comprise an operational amplifier having a differential input and a single-ended output. The second duty cycle may be equal to about 50 percent. The feedback circuit may provide negative feedback. Each inverter of the plurality of inverters may comprise a P-channel transistor and an N-channel transistor. An inverter of the plurality of inverters may have a weaker drive strength than a current-starved inverter of the plurality of current-starved inverters.

In another embodiment, there is provided, a duty cycle correction circuit comprising: a delay line comprising a plurality of current-starved inverters, the delay line having an input for receiving an input clock signal having a first duty cycle and an output for providing an output clock signal having a second duty cycle; an amplifier having an input coupled to the output of the delay line, and an output coupled to each current-starved inverter of the plurality of current-starved inverters; and a plurality of inverters, an inverter of the plurality of inverters coupled in parallel with a current-starved inverter of the plurality of series-connected current-starved inverters. Each current-starved inverter of the plurality of current-starved inverters may comprise: a first P-channel transistor having a first current electrode coupled to a first power supply voltage terminal, a control electrode for receiving the input clock signal, and a second current electrode; a second P-channel transistor having a first current electrode coupled to the second current electrode of the first P-channel transistor, a control electrode coupled to an output terminal of the feedback circuit, and a second current electrode; a first N-channel transistor having a first current electrode coupled to the second current electrode of the second P-channel transistor, a control electrode coupled to the control electrode of the second P-channel transistor, and a second current electrode; and a second N-channel transistor having a first current electrode coupled to the second current electrode of the first N-channel transistor, a control electrode coupled to the control electrode of the first P-channel transistor, and a second current electrode coupled to a second power supply voltage terminal. Each inverter of the plurality of inverters may have a weaker drive strength than each current-starved inverter of the plurality of current-starved inverters. The amplifier may be characterized as being an operational amplifier having a differential input and a single-ended output. Each current-starved inverter of the plurality of current-starved inverters may comprise: a first P-channel transistor having a first current electrode coupled to a first power supply voltage terminal, a control electrode coupled to an output terminal of the amplifier, and a second current electrode; a second P-channel transistor having a first current electrode coupled to the second current electrode of the first P-channel transistor, a control electrode coupled to receive an input clock signal, and a second current electrode; a first N-channel transistor having a first current electrode coupled to the second current electrode of the second P-channel transistor, a control electrode coupled to the control electrode of the second P-channel transistor, and a second current electrode; and a second N-channel transistor having a first current electrode coupled to the second current electrode of the first N-channel transistor, a control electrode coupled to the control electrode of the first P-channel transistor, and a second current electrode coupled to a second power supply voltage terminal. The second duty cycle may be equal to about 50 percent.

In yet another embodiment, there is provided, a duty cycle correction circuit comprising: a delay line comprising a plurality of delay cells coupled together in series, the delay line having an input for receiving an input clock signal and an output for providing an output clock signal, each delay cell of the plurality of delay cells comprising: a current-starved inverter having a first input for receiving a clock signal, a second input for receiving a bias voltage, and an output; a first inverter having an input coupled to the output of the current-starved inverter, and an output; and a second inverter having an input coupled to the input of the current-starved inverter, and an output coupled to the output of the current starved inverter; and a feedback amplifier having an input coupled to the output of the delay line, and an output coupled to second input of the current-starved inverter of each delay cell of the plurality of delay cells. The current-starved inverter may comprise: a first P-channel transistor having a first current electrode coupled to a first power supply voltage terminal, a control electrode for receiving the input clock signal, and a second current electrode; a second P-channel transistor having a first current electrode coupled to the second current electrode of the first P-channel transistor, a control electrode for receiving the bias voltage, and a second current electrode; a first N-channel transistor having a first current electrode coupled to the second current electrode of the second P-channel transistor, a control electrode coupled to the control electrode of the second P-channel transistor, and a second current electrode; and a second N-channel transistor having a first current electrode coupled to the second current electrode of the first N-channel transistor, a control electrode coupled to the control electrode of the first P-channel transistor, and a second current electrode coupled to a second power supply voltage terminal. The second inverter may have a weaker drive strength than the current-starved inverter. The input clock signal may have a first duty cycle different from 50 percent and the output clock signal may have a second duty cycle corrected to about 50 percent. The feedback amplifier may comprise an operational amplifier having a differential input and a single-ended output.

Figure 3:
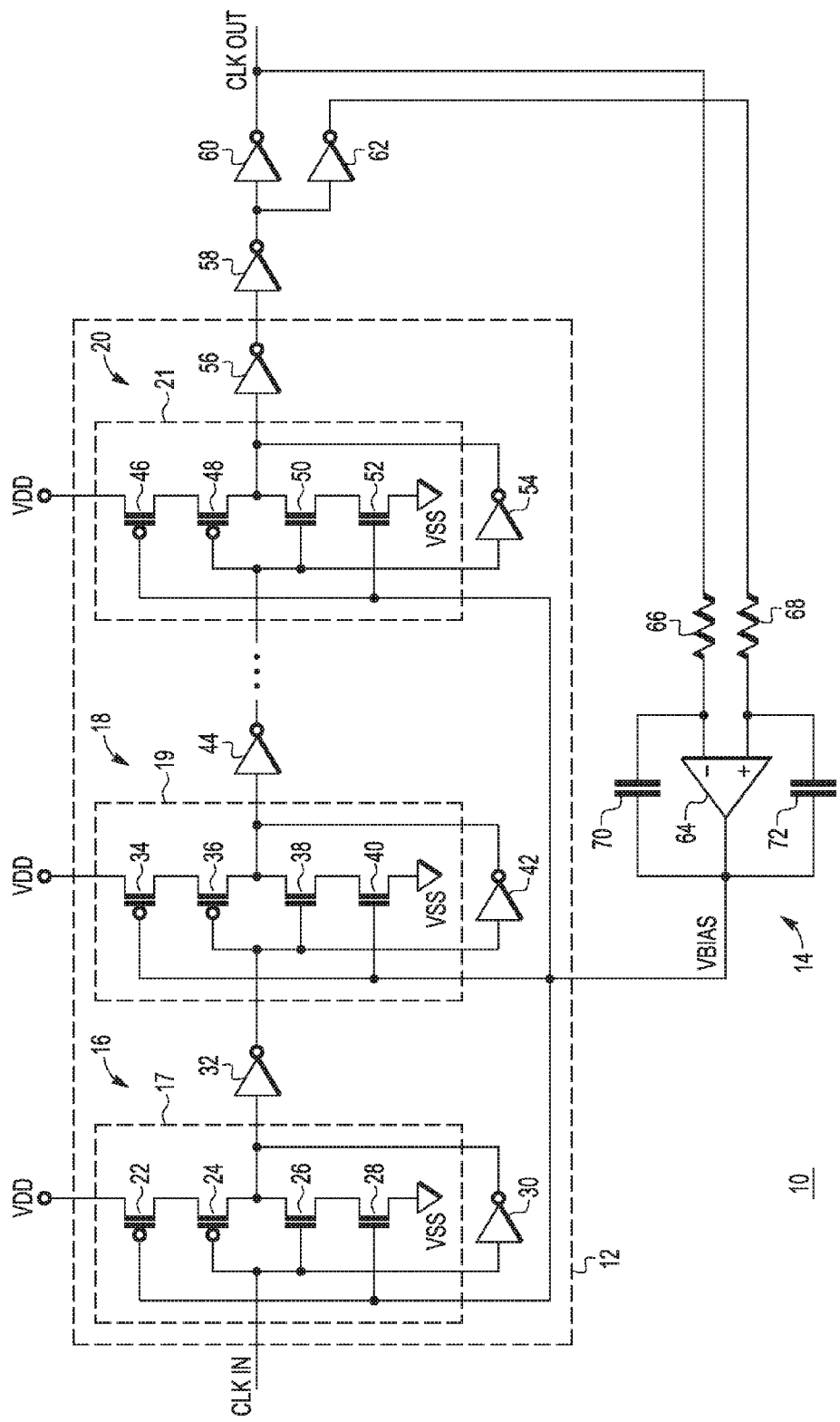
FIG. 3 illustrates, in schematic diagram form, a duty cycle correction circuit in accordance with an embodiment.

FIG. 3 illustrates, in schematic diagram form, duty cycle correction circuit 10 in accordance with an embodiment. Duty cycle correction circuit 10 includes delay line 12, low pass filter 14, buffers 58 and 60, and inverter 62. Delay line 12 includes delay cells 16, 18, and 20. Delay cell 16 includes current-starved inverter 17 and inverters 30 and 32. Delay cell 18 includes current-starved inverter 19 and inverters 42 and 44. Delay cell 20 includes current-starved inverter 21 and inverters 54 and 56. Current-starved inverter 17 includes P-channel transistors 22 and 24, and N-channel transistors 26 and 28. Current-starved inverter 19 includes P-channel transistors 34 and 36, and N-channel transistors 38 and 40. Current-starved inverter 21 includes P-channel transistors 46 and 48, and N-channel transistors 50 and 52. Low pass filter 14 includes operational amplifier 64, resistors 66 and 68, and capacitors 70 and 72.

In delay line 12, delay cells 16, 18, and 20 are connected together in series. In delay cell 16, current-starved inverter 17 is connected in series with inverter 32 and in parallel with inverter 30. In delay cell 18, current-starved inverter 19 is connected in series with inverter 44 and in parallel with inverter 42. In delay cell 20, current-starved inverter 21 is connected in series with inverter 56 and in parallel with inverter 54. An input of delay cell 16 is for receiving input clock signal CLK IN, and output of delay cell 20 provides an output clock signal that is buffered by buffers 58 and 60 and then provided as output clock signal CLK OUT having a 50 percent duty cycle. An output of inverter 32 is connected to an input of current-starved inverter 19 and an output of inverter 44 is connected to an input of current-starved inverter 19, and so on to the last delay cell.

In current-starved inverter 17, P-channel transistor 22 has a first current electrode (source) connected to power supply voltage terminal VDD, a control electrode (gate) connected to the output of operation amplifier 14, and a second current electrode (drain). P-channel transistor 24 has a first current electrode connected to the second current electrode of P-channel transistor 22, a control electrode for receiving input clock signal CLK IN, and a second current electrode. N-channel transistor 26 has a first current electrode (drain) connected to the second current electrode of P-channel transistor 24, control electrode connected to the control electrode of P-channel transistor 24, and a second current electrode. N-channel transistor 28 has a first current electrode connected to the second current electrode of N-channel transistor 26, a control electrode connected to the output of terminal of operational amplifier 14, and a second current electrode connected to power supply voltage terminal VSS. In one embodiment, VDD is coupled to receive a positive supply voltage, for example, one volt and VSS is coupled to ground. In other embodiments, the voltages may be different. Inverter 30 has an input connected to the control electrodes of P-channel transistor 24 and N-channel transistor 26, and an output connected to the second current electrode of P-channel transistor 24 and the first current electrode of N-channel transistor 26. Inverter 32 has an input connected to the second current electrode of P-channel transistor 24 and to the first current electrode of N-channel transistor 26. Delay cells 18 and 20 connected together the same as delay cell 16.

In operation, current-starved inverter 17 receives an input clock signal CLK IN that may have a duty cycle that is different from 50 percent. In response to bias voltage VBIAS, P-channel transistor 22 provides a current source for the inverter comprising P-channel transistor 24 and N-channel transistor 26. Likewise, N-channel transistor 28 provides a current sink in response to bias voltage VBIAS. How quickly inverter 17 switches logic state depends on how much current is being provided to the inverter circuit pair of transistors 24 and 26. The number of current-starved inverters in delay line 12 determines how much the duty cycle can be adjusted. Increasing the voltage VBIAS causes N-channel transistors 28, 40, and 52 to become more conductive and P-channel transistors 22, 34, and 46 to be less conductive, thus causing inverters to pull down the voltage faster. Decreasing bias voltage VBIAS causes the P-channel transistors 22, 34, and 46 to be more conductive and N-channel transistors 28, 40, and 52 to be less conductive, thus causing the inverters to pull up the signal faster. Within each of the delay cells 16, 18, and 20, inverters 32, 44, and 56 provide buffering to the propagating signals so that the next current-starved inverter in the chain of inverters receives a cleaner signal. Buffer 60 and inverter 62 provide a differential output clock signal to the differential inputs of amplifier 64 of low pass filter 14. Low pass filter 14 provides negative feedback to control the current sources and sinks of each current-starved inverter 16, 18, and 20. Operational amplifier 64 functions to make the negative (−) input and positive (+) inputs equal by adjusting the output voltage VBIAS. When the duty cycle of output clock signal CLK OUT is 50 percent, the positive and negative inputs of amplifier 64 will be equal. Ideally, the 50 percent duty cycle occurs when bias voltage VBIAS is about half of the power supply voltage. If the duty cycle of clock signal CLK OUT is greater than 50 percent, then the bias voltage VBIAS will be reduced which will cause current to be sunk slower by transistors 28, 40, and 52, and thus lower the pulse width. If the duty cycle of CLK OUT is less than 50 percent, then the bias voltage VBIAS will be increased which will cause current to be sourced slower by transistors 22, 34, and 46, thus increasing the pulse width of each clock pulse.

An example of when VBIAS may fail to properly bias current-starved inverters 17, 19, and 21 is when power supply voltage VDD drops. If the power supply voltage VDD is reduced from the nominal voltage, there may be a time when the current source and current sink transistors of the current-starved inverters may become completely non-conductive, and shut off the current flow. If current flow is shut off, the current-starved inverters cannot switch states in response to a clock signal. The result is skipped clock pulses where the clock signal stops transitioning, at least momentarily. Skipped pulses of the clock signal may cause reliability issues, corrupted data, and even complete system failure. When VDD is low and the current source and sink are severely starved, the output clock signal CLK OUT may simply disappear rather than be swallowed. When the voltage of bias voltage VBIAS is very close to supply voltage VDD, or to ground, The current source or current sink transistors may switch off completely. Inverters 30, 42, and 54 provide a circuit path for the clock signal that is parallel with the circuit path formed by current starved inverters 17, 19, and 21. The parallel circuit path bypasses the disabled current source or sink, and permits the continuation of the duty cycle correction activity.

To prevent skipped clock pulses, duty cycle correction circuit 10 includes inverters 30, 42, and 54, each connected in parallel with a current-starved inverter 17, 19, and 21, respectively, as illustrated in FIG. 3. Inverters 30, 42, and 54 are relatively weak, that is, a drive strength of the transistors comprising the inverters is relatively low as compared to the drive strength provided by the current-starved inverters. If proper operation of current-starved inverters 17, 19, and 21 is prevented, inverters 30, 42, and 54 will still be able to operate and provide clock signal propagation through delay line 12 and thereby avoid the problem of pulse swallowing. The parallel-connected inverters provide the benefit of placing bounds on how far the duty cycle of a clock signal can stray from 50 percent.

Figure 4:
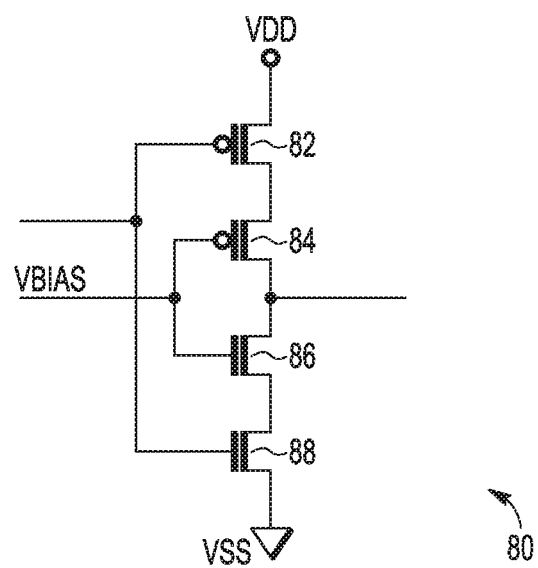
FIG. 4 illustrates, in schematic diagram form, another embodiment of a current-starved inverter for use with the duty cycle correction circuit of FIG. 3.

FIG. 4 illustrates, in schematic diagram form, current-starved inverter 80 for use with duty cycle correction circuit 10 of FIG. 3 in accordance with another embodiment. Current-starved inverter 80 includes P-channel transistors 82 and 84 and N-channel transistors 86 and 88. The gates of P-channel transistor 82 and N-channel transistor 88 are connected together to receive an input clock signal. Transistors 82 and 88 perform the logical function of an inverter. P-channel transistor 84 is a current source and N-channel transistor 86 is a current sink, both responsive to bias voltage VBIAS. Current-starved inverter 80 can be substituted for each of current-starved inverters 16, 18, or 20 and functions similarly.

Figure 5:
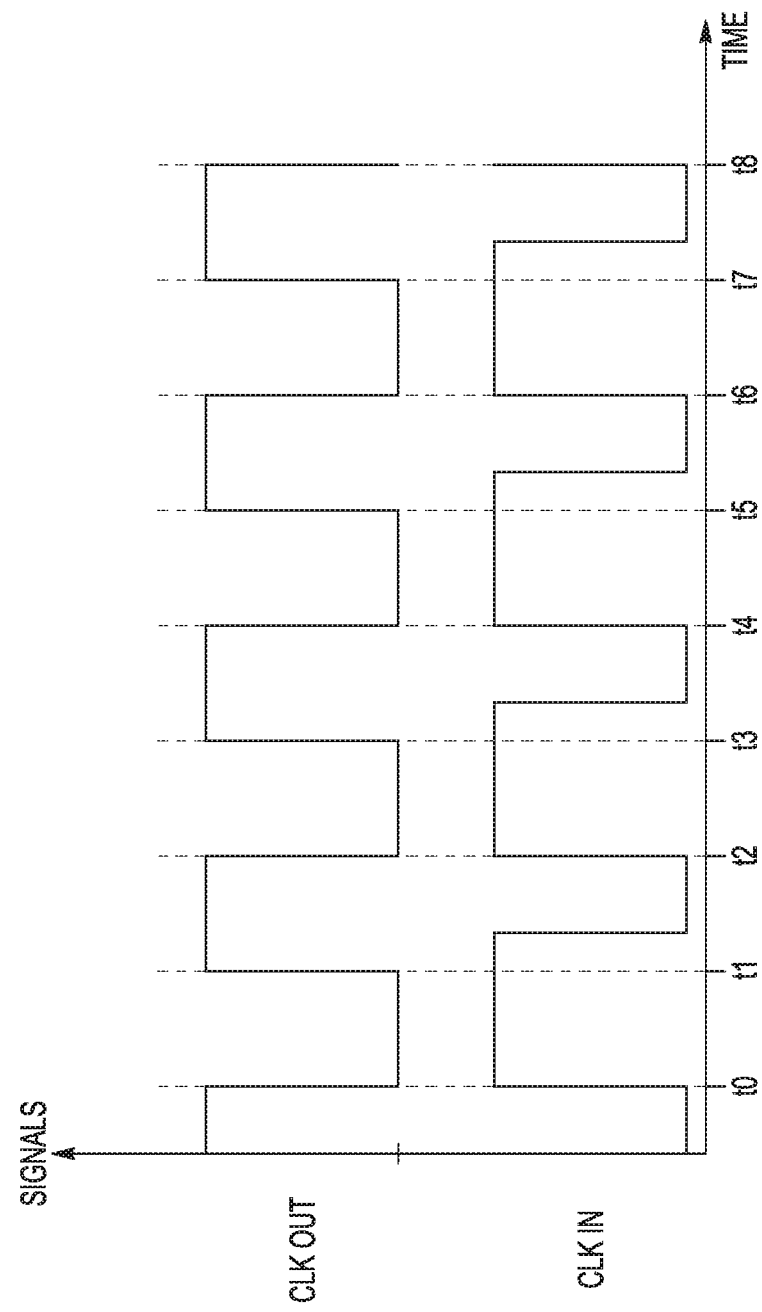
FIG. 5 illustrates a timing diagram of input and output clock signals for the duty cycle correction circuit of FIG. 3.

FIG. 5 illustrates a timing diagram of input and output clock signals for duty cycle correction circuit 10 of FIG. 3. Four periods of input clock signal CLK IN are shown between times t0 and t8. The input clock signal CLK IN has a duty cycle different from 50 percent. Four periods of output clock signal CLK OUT has a duty cycle of 50 percent. Input clock signal CLK IN and output clock signal CLK OUT have the same frequency.

Figure 6:
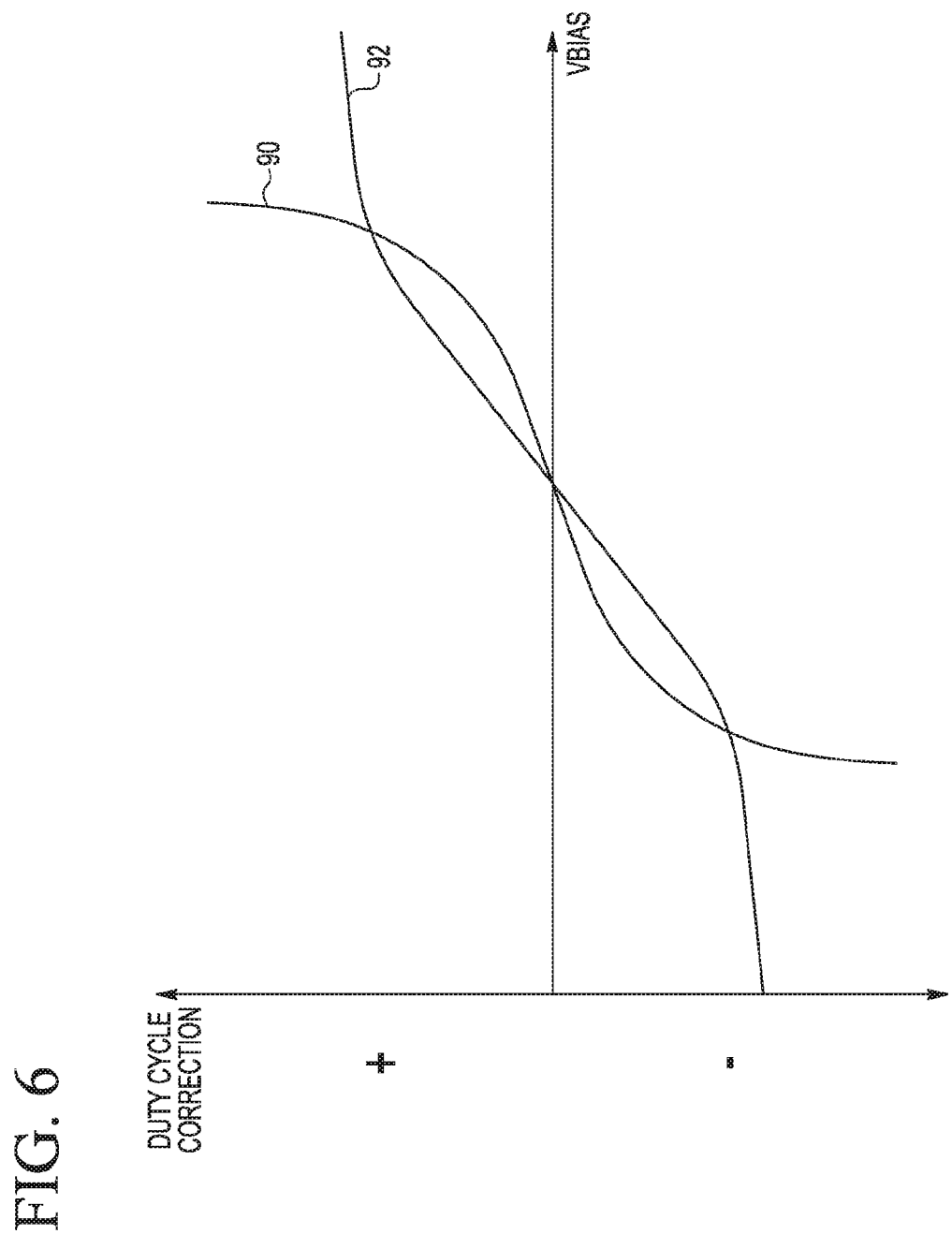
FIG. 6 illustrates a diagram of duty cycle correction versus bias voltage for the duty cycle correction circuits of FIG. 1 and FIG. 3.

FIG. 6 illustrates a diagram of duty cycle correction versus bias voltage VBIAS for prior art duty cycle correction circuit 8 of FIG. 1 and duty cycle correction circuit 10 of FIG. 3. The illustrated DUTY CYCLE CORRECTION on the vertical axis is the difference between the duty cycle of an output clock signal CLK OUT and the duty cycle of an input clock signal CLK IN. The DUTY CYCLE CORRECTION is plotted against bias voltage VBIAS on the horizontal axis. The plus sign (+) indicates the area of the diagram where duty cycle correction is positive and the negative sign (−) indicates the area of the diagram when the duty cycle correction is negative. Curve 90 is the plot for duty cycle correction circuit 8 and Curve 92 is the plot for duty cycle correction circuit 10. As can be seen in FIG. 6, curve 92 indicates that duty cycle correction circuit 10 is bounded to a certain positive duty cycle correction and certain negative duty cycle correction. This is because the parallel inverters 30, 42, and 54 prevent the clock from stopping due to the current sources or current sinks starving the inverter. In contrast, curve 90 shows that the duty cycle correction of duty cycle correction circuit 8 is unbounded, and the current-starved inverters may prevent the clock signal from transitioning under certain conditions.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention is described herein with reference to specific embodiments, various modifications and changes can be made without departing from the scope of the present invention as set forth in the claims below. For example, the above-described embodiment corrects a duty cycle to 50 percent. Other embodiments may correct the duty cycle to a duty cycle different from 50 percent by, for example, including asymmetry in amplifier 64. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims. Generally, in the above-described embodiment, a current electrode is a source or drain and a control electrode is a gate of a metal-oxide semiconductor (MOS) transistor. Other transistor types may be used in other embodiments.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A duty cycle correction circuit comprising:
   a plurality of series-coupled current-starved inverters having a beginning inverter for receiving a periodic input signal having a first duty cycle and a ending inverter for providing an output clock signal having a second duty cycle;
   a feedback circuit coupled between the last current-starved inverter and the beginning current-starved inverter of the plurality of series-coupled current starved inverters; and
   a plurality of inverters, an inverter of the plurality of inverters coupled in parallel with a current-starved inverter of the plurality of series-connected current-starved inverters.

2. The duty cycle correction circuit of claim 1, wherein each of the current-starved inverters comprises:
   a first P-channel transistor having a first current electrode coupled to a first power supply voltage terminal, a control electrode for receiving the input clock signal, and a second current electrode;
   a second P-channel transistor having a first current electrode coupled to the second current electrode of the first P-channel transistor, a control electrode coupled to an output terminal of the feedback circuit, and a second current electrode;
   a first N-channel transistor having a first current electrode coupled to the second current electrode of the second P-channel transistor, a control electrode coupled to the control electrode of the second P-channel transistor, and a second current electrode; and
   a second N-channel transistor having a first current electrode coupled to the second current electrode of the first N-channel transistor, a control electrode coupled to the control electrode of the first P-channel transistor, and a second current electrode coupled to a second power supply voltage terminal.

3. The duty cycle correction circuit of claim 2, wherein an output of the feedback circuit is coupled to the current electrodes of the first P-channel transistor and the second N-channel transistor of each of the current-starved inverters.

4. The duty cycle correction circuit of claim 1, wherein the feedback circuit comprises a low pass filter.

5. The duty cycle correction circuit of claim 4, wherein the low pass filter comprises an operational amplifier having a differential input and a single-ended output.

6. The duty cycle correction circuit of claim 1, wherein the second duty cycle is equal to about 50 percent.

7. The duty cycle correction circuit of claim 1, wherein the feedback circuit provides negative feedback.

8. The duty cycle correction circuit of claim 1, each inverter of the plurality of inverters comprises a P-channel transistor and an N-channel transistor.

9. The duty cycle correction circuit of claim 1, wherein an inverter of the plurality of inverters has a weaker drive strength than a current-starved inverter of the plurality of current-starved inverters.

10. A duty cycle correction circuit comprising:
- a delay line comprising a plurality of current-starved inverters, the delay line having an input for receiving an input clock signal having a first duty cycle and an output for providing an output clock signal having a second duty cycle;
- an amplifier having an input coupled to the output of the delay line, and an output coupled to each current-starved inverter of the plurality of current-starved inverters; and
- a plurality of inverters, an inverter of the plurality of inverters coupled in parallel with a current-starved inverter of the plurality of series-connected current-starved inverters.

11. The duty cycle correction circuit of claim 10, wherein each current-starved inverter of the plurality of current-starved inverters comprises:
- a first P-channel transistor having a first current electrode coupled to a first power supply voltage terminal, a control electrode for receiving the input clock signal, and a second current electrode;
- a second P-channel transistor having a first current electrode coupled to the second current electrode of the first P-channel transistor, a control electrode coupled to an output terminal of the feedback circuit, and a second current electrode;
- a first N-channel transistor having a first current electrode coupled to the second current electrode of the second P-channel transistor, a control electrode coupled to the control electrode of the second P-channel transistor, and a second current electrode; and
- a second N-channel transistor having a first current electrode coupled to the second current electrode of the first N-channel transistor, a control electrode coupled to the control electrode of the first P-channel transistor, and a second current electrode coupled to a second power supply voltage terminal.

12. The duty cycle correction circuit of claim 10, wherein each inverter of the plurality of inverters has a weaker drive strength than each current-starved inverter of the plurality of current-starved inverters.

13. The duty cycle correction circuit of claim 10, wherein the amplifier is characterized as being an operational amplifier having a differential input and a single-ended output.

14. The duty cycle correction circuit of claim 10, wherein each current-starved inverter of the plurality of current-starved inverters comprises:
- a first P-channel transistor having a first current electrode coupled to a first power supply voltage terminal, a control electrode coupled to an output terminal of the amplifier, and a second current electrode;
- a second P-channel transistor having a first current electrode coupled to the second current electrode of the first P-channel transistor, a control electrode coupled to receive an input clock signal, and a second current electrode;
- a first N-channel transistor having a first current electrode coupled to the second current electrode of the second P-channel transistor, a control electrode coupled to the control electrode of the second P-channel transistor, and a second current electrode; and
- a second N-channel transistor having a first current electrode coupled to the second current electrode of the first N-channel transistor, a control electrode coupled to the control electrode of the first P-channel transistor, and a second current electrode coupled to a second power supply voltage terminal.

15. The duty cycle correction circuit of claim 10, wherein the second duty cycle is equal to about 50 percent.

16. A duty cycle correction circuit comprising:
- a delay line comprising a plurality of delay cells coupled together in series, the delay line having an input for receiving an input clock signal and an output for providing an output clock signal, each delay cell of the plurality of delay cells comprising:
  - a current-starved inverter having a first input for receiving a clock signal, a second input for receiving a bias voltage, and an output;
  - a first inverter having an input coupled to the output of the current-starved inverter, and an output; and
  - a second inverter having an input coupled to the input of the current-starved inverter, and an output coupled to the output of the current starved inverter; and
- a feedback amplifier having an input coupled to the output of the delay line, and an output coupled to second input of the current-starved inverter of each delay cell of the plurality of delay cells.

17. The duty cycle correction circuit of claim 16, wherein the current-starved inverter comprises:
- a first P-channel transistor having a first current electrode coupled to a first power supply voltage terminal, a control electrode for receiving the input clock signal, and a second current electrode;
- a second P-channel transistor having a first current electrode coupled to the second current electrode of the first P-channel transistor, a control electrode for receiving the bias voltage, and a second current electrode;
- a first N-channel transistor having a first current electrode coupled to the second current electrode of the second P-channel transistor, a control electrode coupled to the control electrode of the second P-channel transistor, and a second current electrode; and
- a second N-channel transistor having a first current electrode coupled to the second current electrode of the first N-channel transistor, a control electrode coupled to the control electrode of the first P-channel transistor, and a second current electrode coupled to a second power supply voltage terminal.

18. The duty cycle correction circuit of claim 16, wherein the second inverter has a weaker drive strength than the current-starved inverter.

19. The duty cycle correction circuit of claim 16, wherein the input clock signal has a first duty cycle different than 50 percent and the output clock signal has a second duty cycle corrected to about 50 percent.

20. The duty cycle correction circuit of claim 16, wherein the feedback amplifier comprises an operational amplifier having a differential input and a single-ended output.

* * * * *